United States Patent [19]

Kano et al.

[11] 4,117,587
[45] Oct. 3, 1978

[54] NEGATIVE-RESISTANCE SEMICONDUCTOR DEVICE

[75] Inventors: Gota Kano, Nagaoka-kyo; Hitoo Iwasa, Takatsuki, both of Japan

[73] Assignee: Matsushita Electronics Corporation, Kadoma, Japan

[21] Appl. No.: 712,583

[22] Filed: Aug. 6, 1976

Related U.S. Application Data

[63] Continuation-in-part of Ser. No. 683,824, May 6, 1976, abandoned, which is a continuation of Ser. No. 526,931, Nov. 25, 1974, abandoned.

[30] Foreign Application Priority Data

Nov. 30, 1973 [JP] Japan ................................. 48-135552

[51] Int. Cl.² ............................................... B01J 17/00
[52] U.S. Cl. ......................................... 29/571; 29/578; 357/42
[58] Field of Search ..................... 29/571, 578; 357/22, 357/42

[56] References Cited

U.S. PATENT DOCUMENTS

| | | | |
|---|---|---|---|
| 3,453,504 | 7/1969 | Compton | 357/22 |
| 3,538,399 | 11/1970 | Bresee | 357/22 |
| 3,646,665 | 3/1972 | Kim | 29/571 |

OTHER PUBLICATIONS

Ostefjells, "Negative Resistance Circuit ... Transistors", Proc. IEEE, vol. 53 (4/65), p. 404.

Primary Examiner—W. Tupman
Attorney, Agent, or Firm—Cushman, Darby & Cushman

[57] ABSTRACT

A pair of field-effect transistors (hereinafter referred to as FETs) of p-channel type and n-channel type, respectively, both to be electrically actuated in a depletion mode, are formed on a single semiconductor substrate, for instance, a single silicon substrate, and both sources or both drains are connected to each other, or the source of one FET and the drain of the other FET are connected to each other, whereby the pair of FETs are series-connected, and the gate electrode of each FET is connected to the drain electrode or the source electrode that is not series connected in the above-mentioned way, respectively, of the other FET. The device is characterized in that each FET has each back-gate electrode region behind the channel. Preferably, such back-gate regions are high-doped diffused regions.

When a voltage of specified range is applied across both non-series-connected electrodes, i.e., the two external terminals, the resulting voltage-current characteristic presents a so-called dynatron-type characteristic, producing a negative-resistance phenomenon over a fairly wide range of applied voltage. Since this device is, as seen from outside as one device, a two-terminal device constituted on a single substrate comprising FETs with back-gate electrode, it is not only fit to be highly integrated but also able to produce a state of virtually zero value of cut-off current. Consequently, this device can be utilized for switching, memorization, large amplitude oscillation, and other various uses, with low Vth2 value.

4 Claims, 4 Drawing Figures

NEGATIVE-RESISTANCE SEMICONDUCTOR DEVICE

This application is a continuation-in-part of application Ser. No. 683,,824, filed May 6, 1976, now abandoned, which was in turn a continuation of Ser. No. 526,931, filed Nov. 25, 1974, now abaondoned.

This invention relates to an improved negative-resistance semiconductor device comprising complementary field-effect transistors (hereinafter referred to as FETs), and particularly concerns a unitary circuit cell of two-terminal device (as seen from outside) bearing complementary field-effect transistors in a single substrate.

Conventional negative-resistance semiconductor devices, are known in which a single-element type is realized by a physical mechanism and in which a composite type is composed of a plural number of discrete semiconductor elements wired together to form a circuit. The former type is best represented by devices showing N-figured negative-resistance characteristic such as tunnel diodes, Gunn diodes, etc. and devices showing S-figured negative-resistance characteristic such as thyristers, uni-junction transistors, etc. The latter type is best represented by a flip-flop circuit showng S-figure characteristics or circuit composed of a serially connected pair of complementary field-effect transistors showing N-figured characteristics, as shown in FIG. 1.

Out of the above mentioned known devices, only devices showing the S-figured characteristic are in wide practical use now. Devices showing the N-figured characteristic are used only for special uses. The main reason therefor is that in the conventional N-figured negative-resistance single element realized by the physical mechanism of the tunnel diode, Gunn diode, etc. of the former type, the electric current in the OFF state (or in the valley range of the N-figured characteristic) is relatively large, and hence, essentially complete cut-off of current is not realizable. Moreover, in the circuit formed by the series connection of a pair of complementary field-effect transistors of the latter type, the difficulty of integrating on tiny single-chips is a major drawback.

SUMMARY OF THE INVENTION

The primary object of this invention is to provide a device having a dynatron type characteristic with low Vth2 value and leaking very little current in the higher voltage stable range (so-called cut-off current), namely, a virtually complete cut-off current characteristic, in the form of a composite circuit integrating complementary field-effect transistors on a single substrate.

The second object of this invention is to realize a tiny integrated circuiit element occupying very small area of the substrate per single unit cell, and hence, to provide a negative-resistance semiconductor device having a high density.

This invention provides a device having a circuit constitution wherein two complementary field-effect transistors, both with depletion mode, formed on a single substrate are series-connected to each other, and the gate electrode of each FET is connected to the non-series-connected source or drain of the other FET, and vice versa.

In the foregoing, the series-connections of complementary FETs mean series-connections of channels of the complementary transistors by connecting the respective source electrodes of the n-channel type transistor and of the p-channel type transistor, or the respective drain electrode of both transistors, or the source electrode of one transistor with the drain electrode of the other transistor. On the other hand, the non-series-connected electrodes mean electrodes of the FETs not series-connected like in the foregoing manners. For example, when both source electrodes of both transistors are connected to each other, the drain electrodes of both transistors fall in this latter category.

In the device of this invention, the internal connections for the circuit constitution are made by using electrode layers of electrically conducting metals such as Al, Au, etc. Therefore, said device constitutes essentially the so-called two-terminal circuit device wherein the external terminals, namely, the input terminals for the input voltage are the pair of non-series-connected electrodes.

DETAILED DISCLOSURE OF THE INVENTION

Figure 1:
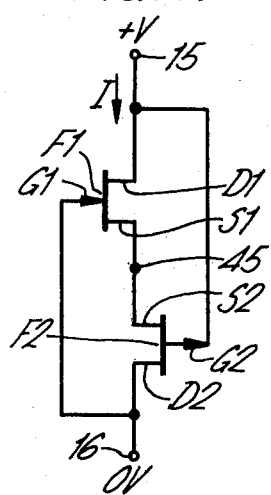
FIG. 1 is an equivalent circuit diagram explaining the theory of this invention.

As shown by the equivalent network constitution of FIG. 1, the negative-resistance semiconductor device of this invention comprises, as a circuit characteristic, a pair of serially connected FETs F1 and F2 electrically actuated in a depletion mode and differing in the type of their conductive channels from each other, so-called complementary field-effect transistors. This particular circuit is old and described for example in *IEEE Transactions on Circuit Theory*, March 1963, pages 25–35 and *Proceedings of The IEEE*, April 1965, page 404.

FIG. 1 shows a circuit example as disclosed in the prior art in which the gate electrode G1 of an n-channel type FET F1 is connected to the drain electrode D2 of a p-channel type FET F2, and the gate electrode G2 of the p-channel type FET F2 is connected to the drain electrode D1 of the n-channel type FET F1. Both source electrodes S1 and S2 of both FETs F1 and F2 are further series-connected to each other at a junction 45.

To observe them from the constitutional characteristic, complementary FETs both actuated in depletion mode are formed on the principal face of a semiconductor substrate of a specified conductivity type, and the regions of both drains or of both sources or between one drain and the other source of the pair of complementary FETs are connected by known art to series-connect them, and finally, each gate is connected by known art to the electrode not series-connected as above of the other complementary FET.

Figure 2:
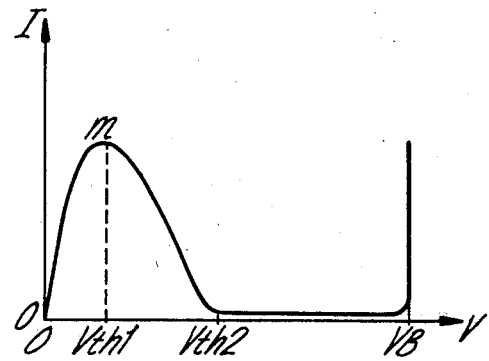
FIG. 2 is a typical voltage-current characteristic chart of the device of this invention.

When a voltage V is applied across one drain electrode D1 and the other drain electrode D2 of the series-connected pair of FETs F1 and F2 (with positive potential on the side of electrode D1), a known current-voltage characteristic as shown in FIG. 2 is obtained between voltage V and source current I. As is seen in FIG. 2, for a time from the starting voltage O, the current I increases showing positive resistance characteristic as the voltage increases, but the current also shows gradually a saturation characteristic, and after the current exceeds the voltage of the peak current point m, namely, the first threshold voltage Vth1, namely, in the region between Vth1 and Vth2, the current acutely declines as the voltage increases, showing a so-called negative-resistance characteristic. Finally, when the voltage exceeds the second threshold voltage Vth2, the current I enters the cut-off state. This cut-off state of the current continues until the voltage reaches VB point where one of the FETs begins to break-down. When the voltage passes over the VB point, a break-down current is produced. In the circuit constitution of FIG. 1, there are the first stable region of $O < V \leq Vth1$, and the second stable region of $Vth2 \leq V < VB$, and the unstable state lies in the applied voltage range of $Vth1 < V < Vth2$.

Figure 3:
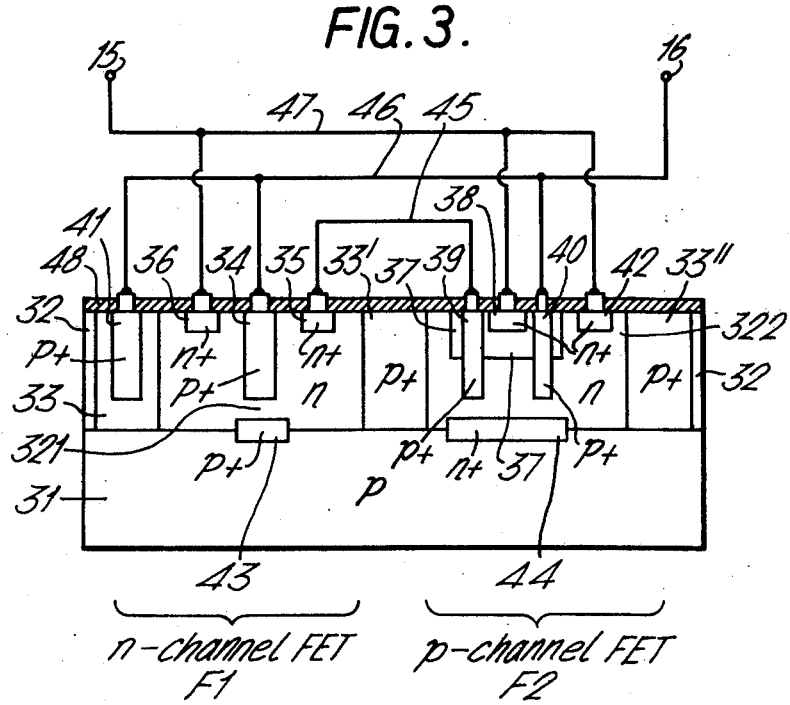
FIG. 3 is a cross-sectional view of one example embodying this invention.

FIG. 3 is a cross-sectional view of an example of the structure shown in FIG. 1 and proposed by the present invention. In FIG. 3, on a silicon substrate 31 of boron-doped p-type conductivity having specific resistivity of 10–30Ωcm, an n-type epitaxially grown layer 32 of about 4μ thickness having specific resistivity of 6Ωcm is formed. Boron-diffused p+-type diffused separation regions 33, 33' and X" of reaching the substrate region 31 are formed in the n-type region 32, so that the n-type region 32 is divided into two parts 321 and 322, wherein the first region 321 is for the N-channel FET F1 and the second region 322 is for the P-channel FET F2.

in the bottom part of the first growth region 321, namely in the interface between the substrate region 31 and the first growth region 321, a buried region 43 of p+-conductivity type is preferably formed by, for instance, selective diffusing. In the first region 321, a p+-conductivity type region as the gate region 34, together with a pair of n+-conductivity type regions as the source region 35 and the drain region 36, respectively, are formed by diffusing.

In the bottom part of the second growth region 322, namely in the interface between the substrate region 31 and the second growth region 322, a buried region 44 of n+-conductivity type is preferably formed by selective diffusing. In the second region 322, a boron diffused p-type region 37 having surface concentration of $1 \times 10^{16}$ atom/cm$^3$ ~ $2 \times 10^{16}$ atom/cm$^3$ and depth of about 1.0μ to serve as p-channel is formed. A pair of p+-conductivity type regions 39 and 40 to serve as the source region and the drain region, respectively, are formed in the p-channel region 37. Also an n+-conductivity region 38 having depth of about 0.5μ to serve as the gate region is formed in the p-channel region 37, so that diffusion front of the region 38 is within the region 37. On the surface of the device, an insulating film 48 of, for instance, SiO$_2$ remains. Then, the gate region 34, a conductive region 41 of the first FET F1 and the drain region 40 of the second FET F2 are connected in common by bonding conductor 46 to the terminal 16. Also the drain region 36 of the first FET F1, the gate region 38 and the conductive region 42 of the second FET F2 are connected in common by a bonding conductor 47 to the terminal 15. And further, the source regions 35 and 39 are connected to each other by a bonding conductor 45. The abovementioned bonding conductors 45, 46 and 47 are preferably metal strips disposed on the insulating layers, but also may be known bonding wires.

Thus, in the first n-conductivity type region 321, the n-channel FET F1 having the source region 35, the drain region 36, the gate region 34, the n-channel 321 beneath the bottom part of the gate region 34 and the back-gate region 31 facing the bottom part of the gate region 34 are disposed,. Since the substrate 31 is of p-conductivity type and is connected in ohmic relation to the p+-conductivity type region 33, which is connected to the gate region 34 through the conductive region 41, the part of the substrate 31 that faces the bottom of the gate electrode 34 works as a back-gate. In order to obtain better performance as the back-gate, the buried p+-conductivity type region 43 is preferably disposed at the interface between the substrate region 31 and the channel 321.

In the p-conductivity type channel region 37 which is disposed in the second n-conductivity type region 322, the p-channel FET F2 having the source region 39, the drain region 40, the gate region 38, the p-channel 37 beneath the bottom part of the gate region 38, and the back-gate region 322 are disposed. Since the back-gate region 322 is of n-conductivity type and is connected in ohmic relation to the n+-conductivity type region 42, which is connected to the gate region 38 through the wire 47, the part of the n-conductivity growth region 322 that faces the bottom of the gate electrode 38 works as a back-gate. In order to obtain better performance as the back-gate, the buried n+-conductivity type region 44 is preferably disposed at the interface between the substrate region 31 and the n-conductivity type region 322.

Data of an actual example of the device according to the present invention is as follows:

Substrate 31 — boron-doped p-type silicon substrate, 200μ thick, specific resistance of 20Ωcm.

Buried region 43 — boron-diffused p+-type region, surface impurity concentration of $1 \times 10^{18}$ atoms/cm$^3$.

Buried region 44 — arsenic-diffused n+-type region, surface impurity concentration of $1 \times 10^{19}$ atoms/cm$^3$.

Epitaxially grown first region 32, hence, divided regions 321 & 322 — phosphor-doped n-type epitaxially grown regions, 4μ thick, specific resistance of 6Ωcm.

Separation region 33', and regions 33 and 33" — boron-diffused p+-type region, 5μ thick, surface impurity concentration of $1 \times 10^{19}$ atoms/cm$^3$.

Second region 37 — boron-diffused p-type region, 1.0μ thick, surface impurity concentration of $1.5 \times 10^{16}$ atoms/cm$^3$.

Gate region 34, source region 39, drain region 40 and conduction region 41 — boron-diffused p+-type regions, 1.1μ thick, surface impurity concentration of $1 \times 10^{19}$ atoms/cm$^3$.

So the region 35, drain region 36 and gate region 38 arsenic-diffused n+-type region, 0.5μ thick, surface impurity concentration of $5 \times 10^{19}$ atoms/cm$^3$.

Insulation layer 48 — SiO$_2$ layer, 1.2μ thick.

Effective thickness of the n-channel in the FET F1 — 2.5μ.

Effective thickness of the p-channel in the FET F2 — 0.4μ

Vth1–1 volt.

Vth2 — 3 volts or lower.

VB — 25 volts.

Maximum current — 0.3 miliampere.

Cut-off current — $10^{-1}$ ampere.

As shown in the aforementioned actual example, Vth2 is so low as 3 volts contrasting with 5 to 7 volts of the conventional negative-resistance semiconductor device of the prior arts.

In the construction of the device of the present invention, the buried back-gate regions 43 and 44 have conductivities opposite to those of the channels 321 and 37 of the field effect transistors F1 and F2 comprising those channels, respectively. Resultantly, the conductivity types of buried back-gate regions 43 and 44 are same with those of the gate regions 34 and 38 so as to serve the back-gate, respectively. These back-gate regions 43 and 44 are electrically connected to the back-gate conducting regions 41 and 42, through the regions 33-31 and the region 322, respectively.

By means of the buried high-doped $p^+$ regions 43 and $n^+$ region 44 beneath the n-chanel 321 and the p-channel 37, respectively, a satisfactorily uniform electric fields in the channels are obtainable, attaining good performance of the FETs. Especially, when the epitaxially grown n-channel 321 is thick, the buried region 43 is advantageous in effectively controlling the thickness of the n-channel.

In the present invention, the epitaxially grown region 32 is divided into two parts 321 and 322 by deep separation region 33' which reaches the substrate region 31, and each elementary FET of the complementary FETs is disposed in the divided parts 321 and 322. Therefore, each elementary FET operates independently from the other elementary FET, and accordingly, voltage distribution between the two FETs can be made stable, securing satisfactory negative resistance performance.

Furthermore, since each elementary FET is independent from the other ones, the dispositions of back-gate regions 43 and 44 are designed freely.

Generally, threshold voltages Vth1 and Vth2 of a negative-resistance semiconductor device are dependent on pinch-off voltages of the elementary FETs, and therefore, by improving pinch-off characteristics of the channels 321 and 37 by providing of the back-gate regions 31 and 322 or preferably buried regions 43 and 44, the negative resistance characteristic can be improved to be more stable.

By providing the burried regions 43 and 44, especially second threshold voltage Vth2 can be decreased, and resultantly, performance in lower voltages and stable operation become possible.

Figure 4:
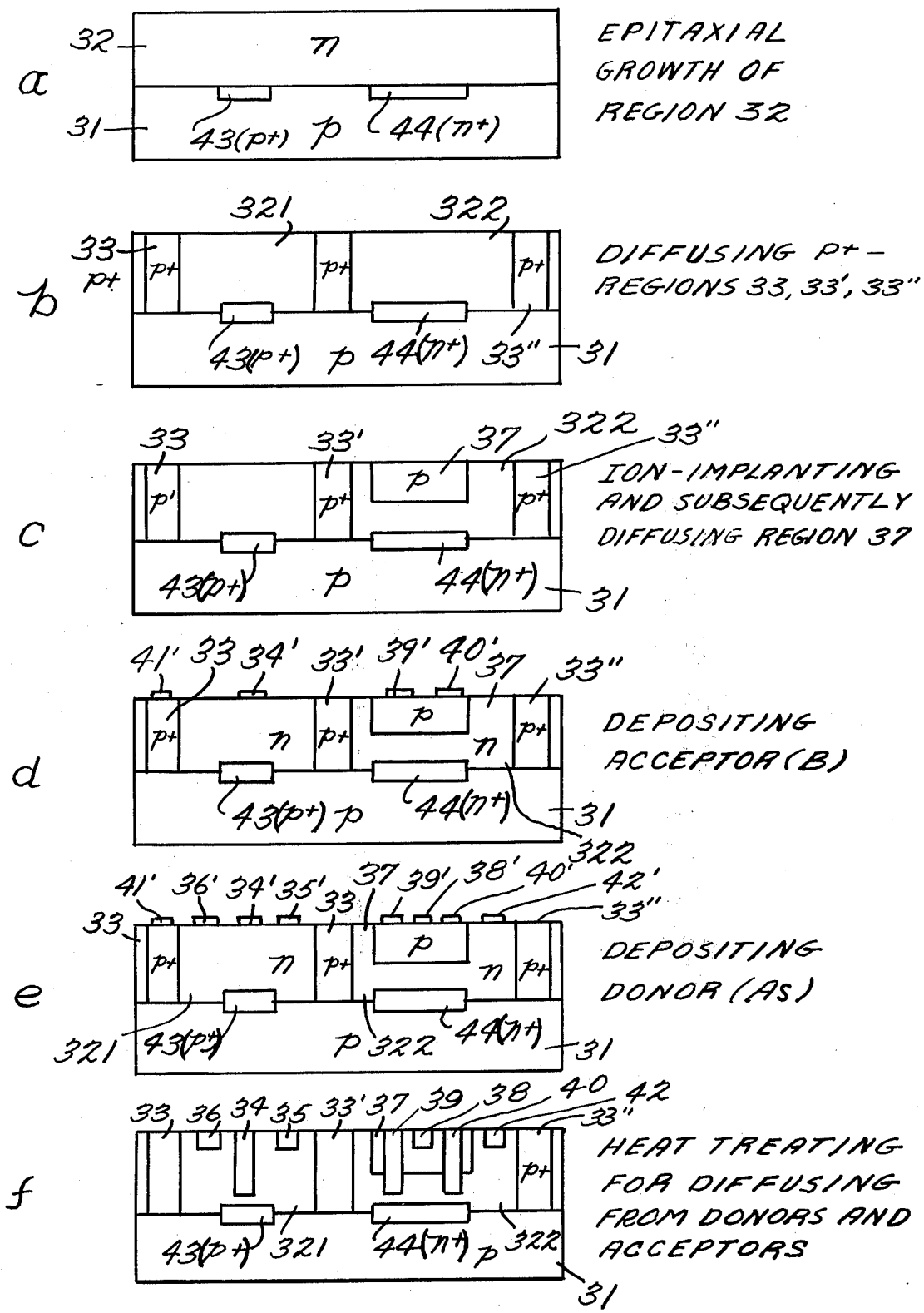
FIG. 4 illustrates the process for making a device such as shown in FIG. 3.

One example of making the negative resistance device of the present invention is elucidated in the below mentioned and the drawing:

A $4\mu$ thick n-type epitaxial region 32 of specific resistivity of $8 \times 10^{14}$ atoms/cm$^3$ surface impurity concentration is formed on a p-type Si-substrate 31 of $6.5 \times 10^{14}$ atom/cm$^3$ surface impurity concentration by means of ordinary epitaxial growth method FIG. 4(a). In case the buried regions 43 and 44 are formed, it is preferable preliminary to form the buried regions 43 and 44 by known diffusion method. Then $p^+$-type isolation regions 33, 33' and 33" are formed in the epitaxial region 32 by known boron-diffusion (FIG. 4(b)). Thereafter, p-type region 37, which becomes a channel region of the p-channel FET, is formed in the isolated n-type region 322 by implanting boron ions through 1000A thick silicon dioxide film on the wafer with the ion beam of $1.5 \times 10^{12}$ ions/cm2 and of 50 KeV energy. Then the wafer is heated-treated at 1150° C for 1 hour. The resultant p-type region 37 is about $1\mu$ deep and its surface impurity concentration is about $1.5 \times 10^{16}$ atoms/cm3 (FIG. 4(c)).

Then, vapor-deposited boron regions 34', 39', 40' and 41' having sheet resistance of 200Ω per square are formed in order to simultaneously form $p^+$-type gate region 34 of the n-channel FET, $p^+$-type source region 39 and drain region 40 of the p-channel FET and preferably back-gate electrode region (i.e., gate contact region) 41 of the n-channel FET (FIG. 4(d)). Subsequently, vapor-deposited arsenic regions 38', 35', 36' and 42' having sheet resistance of 20Ω per square are formed in order to simultaneously form $n^+$-type gate electrode 38 of the p-channel FET, $n^+$-type source region 35 and drain region 36 of the n-channel FET and preferably back-gate electrode region (i.e., gate contact region) 42 of the p-channel FET (FIG. 4(e)). The $p^+$-type regions and the $n^+$-type regions are simultaneously formed by thermally diffusing both of the above-mentioned boron and arsenic by heat-treating the wafer at 1050° C for 30 minutes. As a result of the diffusion, the $p^+$-type regions and the $n^+$-type regions are formed to have depth of 1.1 $\mu$m and 0.5 $\mu$m, respectively, and surface impurity concentration of the diffused regions are $1 \times 10^{19}$ atoms/cm$^3$ for the $p^+$-type regions and $5 \times 10^{19}$ atoms/cm$^3$ for the $n^+$-type region, respectively (FIG. 4(f)). Thereafter, necessary connections to and among the electrodes are made as shown in FIG. 3.

According to empirical studies by the inventors, for obtaining desirable characteristic, namely, for obtaining the second threshold voltage of 1 to 10 volts, in the above-mentioned making, the layer depth and concentration should be within the following ranges n-type epitaxial region 32 . . . . 3 to 8 $\mu$m thick and $5 \times 10^{14}$ to $5 \times 10^{15}$ atoms/cm$^3$ surface impurity concentration.

p-type diffused region 37 . . . . 0.5 to 5 $\mu$m and $5 \times 10^{15}$ to $1 \times 10^{17}$ atoms/cm$^3$ of surface impurity concentration.

Since the elementary FETs are completely separated by the separation regions 33, 33' and 33", any other active elements such as bipolar transistors of pnp type or npn type, or passive elements such as resistors can be disposed on extended parts of the substrate.

The negative-resistance semiconductor device of the present invention can be embodied in the devices having complementary FETs of either insulated gate type of FETs of junction gate type, as well as, in the devices having substrate of n-conductivity type.

Many changes and modifications of the abovementioned embodiments of the invention can, of course, be carried out without departing from the scope thereof. Accordingly that scope is intended to be limited only by the scope of the appended claims.

What is claimed is:

1. A method of making negative-resistance semiconductor devices of the type comprising two complimentary depletion type junction field effect transistors (FETs) interconnected together and the respective gates of said FETs are connected to the drain of the other FET, the method comprising the step of:

forming diffused separation regions in an epitaxial region of a first conductivity type formed on a substrate of a second conductivity type, in a maner such that said diffused separation regions penetrate and hence divide said epitaxial region to form at least two islands which are isolated from each other by p-n junctions, forming a diffused well region of said second conductivity type in one of said islands, depositing shaped members of high concentration donor and of high concentration acceptor on specified portions of surfaces of the other one of said island regions and of said diffused well region, said specified portions being relatively disposed corresponding to the respective gates, drains and sources of said FETs, heat treating for simultaneously diffusing from said members of high concentration donor and said members of high concentration acceptor to form $n^+$-regions and $p^+$-regions, respectively, and thereby the gate, source and drain regions of said FETs, forming contact electrodes to said gate, drain and source regions; and forming electrical connections between the respective source regions of said FETs and between the respective gate regions of each FET to the drain region of the other FET.

2. A method of making a negative-resistance semiconductor device of the type comprising two complementary depletion type junction field effect transistors (FETs) interconnected together and the respective gates of said FETs are connected to the drain of the other FET, the method comprising the steps of:

forming $p^+$-type diffused separation regions in an n-type epitaxial region formed on a p-type substrate, in a manner such that said diffused separation regions penetrate and hence divide said epitaxial region to form at least a first and a second island which are isolated from each other by p-n junctions, forming a p-type diffused region in a second one of said island regions;

depositing a region of high concentration acceptor for forming a gate in said first island region and simultaneously depositing a pair of regions of high concentration acceptor for forming source and drain in said p-type diffused region, depositing a pair of regions of high concentration donor for forming source and drain in said first island region and simultaneously depositing a region of high concentration donor for forming a gate, heat treating for simultaneusly diffusing from said regions of high concentration donor and said regions of high concentration acceptor, thereby to form the source, drain and gate regions of an n-channel FET formed in said first island region and to form the same of a p-channel FET formed in said diffused region, said heat treating being controlled in a manner that depth of said $p^+$-type region formed by diffusion from said acceptor being smaller than the depth of said first island region and depth of said $n^+$-type region being smaller than the depth of said diffused region, and forming electrical connections between the source of one FET to the source of the other FET and between the respective gates of each FET and the drain of the other.

3. The method of claim 1, wherein aid epitaxial growth region is n-type region of 3 to 8$\mu$m thickness and $5 \times 10^{14}$ to $5 \times 10^{15}$ atoms/cm$^3$ surface concentration, said diffused region is p-type region of 0.5 to 5$\mu$m thickness and $5 \times 10^{15}$ to $1 \times 10^{17}$ atoms/cm$^3$ concentration at the surface.

4. A method of making a negative-resistance semiconductor device of the type comprising complementary depletion type junction field effect transistors (FETs) interconnected such that the sources of said FETs are connected together, and the gate of each of said FETs is connected to the drain of the other, said method comprising the steps of:

forming diffused separation regions in an epitaxial region of a first conductivity type formed on a substrate of a second conductivity type, said separation regions penetrating said epitaxial region to divide said epitaxial region and form thereby at least two islands isolated from each other by p-n junctions;

forming a diffused well region of said second conductivity type in one of said islands;

vapor-depositing a first, second and third shaped pellet of high carrier concentration material of said second conductivity type, said first and second pellets being disposed spaced apart on the surface of said well region, and third pellet being disposed on the surface of a second island different than said island containing said well region;

vapor-depositing fourth, fifth and sixth shaped pellets of higher carrier concentration material of said first conductivity type, said fourth pellet being disposed between said first and second pellets on the surface of said well region, and said fifth and sixth pellets being formed adjacent opposite sides of said third pellet on the surface of said second island;

heat treating for simultaneously diffusing said first, second, and fourth pellets into said well region and said third, fifth and sixth pellets into said epitaxial region and well region to simultaneously form thereby the drain, source and gate regions of a first FET and the gate, source and drain regions of a second FET complementary to said first FET;

forming contact electrodes on the surfaces of the respective gate, source and drain regions of said first and second FETs; and forming electrical connections between the respective source regions of said first and second FETs, and between the respective gate regions of said FETs and the drain region of the other.

* * * * *